United States Patent [19]

Wilson et al.

[11] Patent Number: 5,023,815

[45] Date of Patent: Jun. 11, 1991

[54] METHOD AND APPARATUS FOR REGISTERING COLOR FILM SEPARATIONS

[76] Inventors: Monti R. Wilson, 7906 W. 99th St., Overland Park, Kans. 66212; Gerard G. R. Medioni, 1833 Hillsboro Ave., Los Angeles, Calif. 90035

[21] Appl. No.: 389,855

[22] Filed: Aug. 4, 1989

[51] Int. Cl.⁵ .............................................. H04N 5/253
[52] U.S. Cl. ..................................... 364/526; 358/214
[58] Field of Search .............. 364/526, 525, 559, 200, 364/900; 382/8, 22, 1; 358/101, 107, 456, 214, 216; 352/160, 234

[56] References Cited

U.S. PATENT DOCUMENTS

| | | | |
|---|---|---|---|
| 3,736,564 | 5/1973 | Watkins | 364/200 |
| 3,851,315 | 11/1974 | Anderson | 364/200 |
| 4,641,244 | 2/1987 | Wilson et al. | 364/525 |
| 4,837,711 | 6/1989 | Suzuki | 364/559 |
| 4,849,914 | 7/1989 | Medioni et al. | 364/526 |
| 4,875,102 | 10/1989 | Poetsch | 358/216 |
| 4,903,131 | 2/1990 | Lingemann et al. | 358/214 |

Primary Examiner—Parshotam S. Lall
Assistant Examiner—Ellis B. Ramirez
Attorney, Agent, or Firm—Kokjer, Kircher, Bradley, Wharton, Bowman & Johnson

[57] ABSTRACT

An algorithmically based method and apparatus for registering halftone color separations using edge based registration techniques and three registration points on each film separation in order to handle image stretching in both directions. Improved techniques include the use of gray level transformation, an improved U.S.C. predicate, double accuracy interpretation after systematic convolution sampling, finer angle sweeping to achieve smoother edge transitions around sharp corners, elimination of gaps in the edge continuity, enhancement of final edge linking, a more accurate and robust segment matching algorithm, invocation of a registration quality index for quality control checking of each segment picture registration, and reduction of machine cycle time by performing computations concurrently with machine movement.

16 Claims, 6 Drawing Sheets

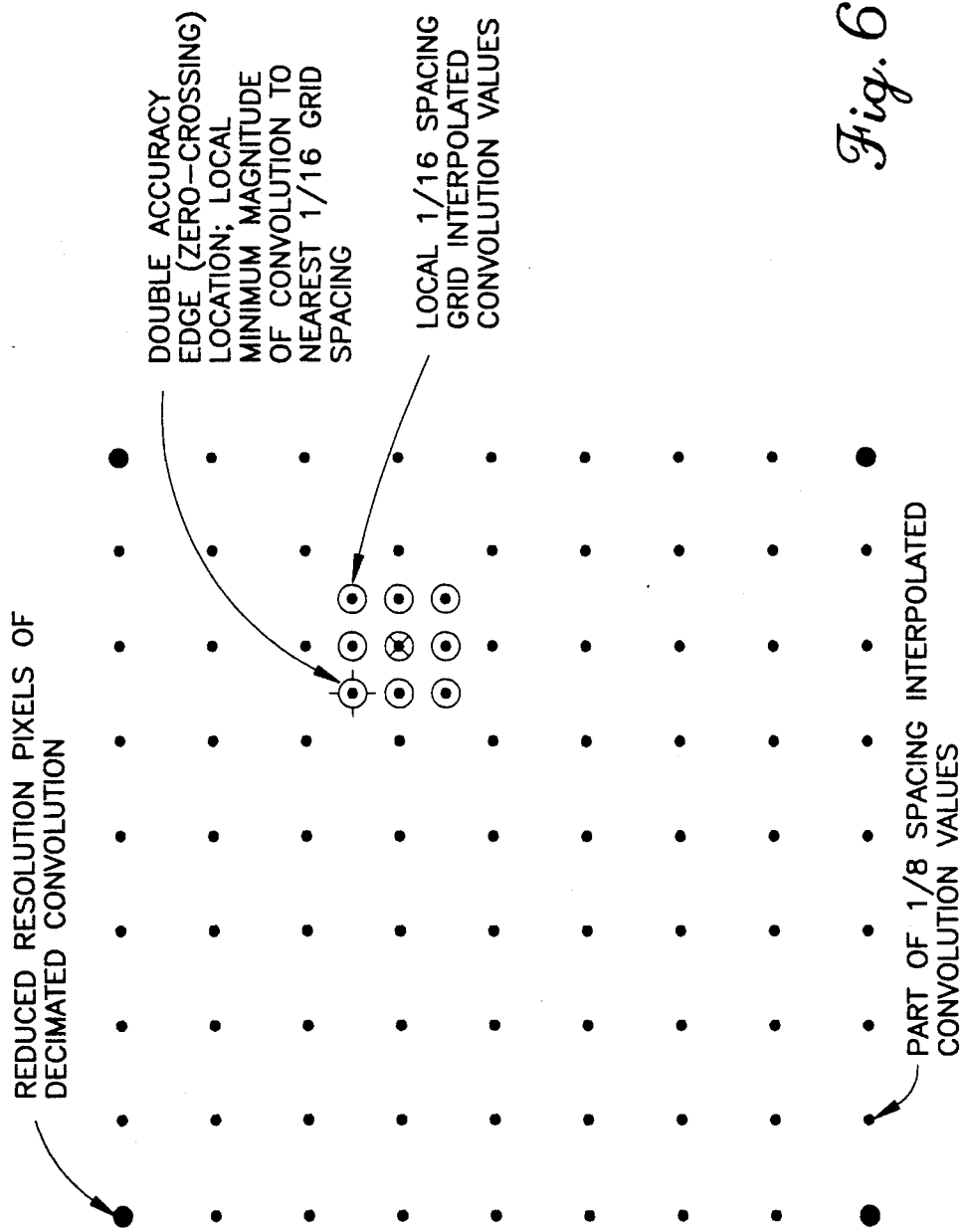

METHOD AND APPARATUS FOR REGISTERING COLOR FILM SEPARATIONS

FIELD OF THE INVENTION

This invention relates in general to the graphics arts and more particularly to the registration of halftone color separation film. Still more particularly, the invention is directed to a method and apparatus that employs improved techniques for accurately and repeatably registering color separation films so that high quality color pictures can be printed.

BACKGROUND OF THE INVENTION

U.S. Pat. No. 4,641,244 to Wilson et al. discloses a method and apparatus for registering color separation film which has many advantages over the manual registration process that had been prevalent in the past. However, the invention disclosed therein has practical limitations which make it useful principally in situations where the pictures have similar digital tones. In recognition of these limitations, an edge based registration system has been developed and disclosed in pending application Ser. No. 099,800, filed Sept. 22, 1987 by Medioni et al. and entitled "Method and Apparatus for Registering Color Separation Film". The edge based system has been found to be advantageous in a number of respects and functions in a satisfactory manner for the most part. However, it has also been found to be subject to problems.

Perhaps most notably, the accuracy of the edge based system is unacceptable in some situations, as when sharp edges are present on the pictures. Typically, the sharpest edges are found in reverse type which is used, for example, in the lettering in four color magazine advertisements. The registration accuracy in this situation is typically about 0.75-1.0 mil, which is to be compared with the accuracy of less than 0.5 mil that can be achieved manually by stripping professionals. Sharp edge registration in general and reverse type registration in particular are of considerable importance in the printing industry because sharp edged detail in a printed publication is rather prominent if there are noticeable registration errors. Consequently, even though registration errors up to 1 mil in ordinary (non-sharp) edge detail are difficult to detect visually and thus acceptable, registration errors greater than 0.5 mil are objectionable in sharp edged detail. Thus, the registration errors in sharp edged detail that result from use of the invention disclosed in pending application Ser. No. 099,800 are unacceptable.

Because the registration schemes used in prior methods are based on only two registration points, the entire film images may not be registered in some circumstances even if both registration points are exactly registered. For example, if the film image is stretched (global image size difference) or if multiple images are placed on a composite film and each such image is placed out of registration by a random error introduced by human error in manually composing the final film (known as "internal misregister") the different color separations may be out of register at some points even though two registration points are in registration. Films that are subject to either image stretching or internal misregister or a combination of the two are referred to as "problem films", and such problem films cannot be accurately registered by two point registration techniques.

A third problem with the edge based technique disclosed in Ser. No. 099,800 is that halftOne images with blurred or fuzzy edge detail are rejected more often than necessary by the quality control check that is used. In order to be practical, the registration technique should be more forgiving as to registration of fuzzy halftone pictures.

SUMMARY OF THE INVENTION

The present invention is directed to an algorithmic based method and apparatus which uses edge based registration techniques that are improved in comparison to those disclosed in pending application Ser. No. 099,800 in order to effect registration more accurately and reliably with more general applicability to a wider class of films, including problem films. Nine specific improvements are provided by the invention in the algorithmic steps that are used to effect registration of halftone film, and another improved feature allows the machine cycle time to be reduced.

In accordance with the invention, a three point registration technique is used in order to minimize problems caused by image stretching. By using three registration points, the image stretching in both directions can be taken into account and a "split the difference" compromise solution can be made to the registration problem. Additionally, a compromise registration can be obtained in cases of internal misregistration.

Another aspect of the invention involves a change in optimal thresholding which allows acceptable registration of pictures having edge detail that is blurred or fuzzy to a greater extent than previously permitted. Accordingly, the registration system is more forgiving and fewer pictures are rejected.

Still another improvement resides in the use of a replacement U.S.C. predicate which guarantees continuity between edges, assures accurate edge directions and avoids both creating edges and missing edges entirely, all of which are problems with the U.S.C. predicate proposed in the past as the algorithm for extracting initial edges. The improved U.S.C. predicate is also characterized by a pre linking step in which each final edge points exactly toward the successor edge and each edge is pointed toward by no more than one predecessor edge.

The present invention is additionally characterized by a particularly significant improvement in the registration error which, as indicated previously, has been unacceptable in the sharp edge detail when past techniques have been used. In accordance with this improved aspect of the invention, zero crossing locations are found to the nearest ¼ mil pixel in order to reduce the error for reverse type and other sharp edge detail to ¼ mil or less. The mechanical apparatus error is likewise ¼ mil at the most, providing an overall error of 0.5 mil or less. As indicated previously, this error is acceptable and results in a registration improvement which is visually dramatic in the sharp edge detail.

Another aspect in which the method and apparatus is improved is in the manner of carrying out the edge bias correction step. Rather than simply varying the normal to the predicate edge direction, by 45° in both directions from the nominal direction to determine if there is an improvement in the maximization of the zero crossing slope, the present invention carries out the variation in the normal in finer increments of 22.5°. Although additional computation time is required, the finer angle sweeping results in much smoother edge transitions around sharp corners which justifies the added computation time.

An additional improvement provided by the invention is the elimination of possible gaps in the edge continuity. In the past technique, weak edges are removed by thresholding criteria, and a gap in the edge continuity can result if a weak edge having two strong edge neighbors is removed. This disadvantage is eliminated in the present invention by modifying the application of the thresholding such that only chains of edges connected end to end can be removed and only when every edge in the chain is a rejection candidate according to the thresholding criteria.

The final edge linking step is also improved, in part because of the pre-linking step of the improved U.S.C. predicate that is employed. Since every edge that has a successor edge point exactly to the successor, the final linking provides arrays (one per segment picture) of edge direction pointers which can be followed from edge to edge to trace linked edges.

A further improvement avoids the occasional inaccuracy that can result from ambiguous rotational alignment between segment pictures having rotational symmetry. This is accomplished in the final least squares segment registration step by omitting the rotational degree of freedom that is permitted in the prior system. The least squares final equation coefficients are weighted with the contributing segment pair overlap, thus emphasizing segments that match and deemphasizing those that do not. A more accurate and more robust segment matching algorithm is thus provided.

A final algorithmic improvement involves invocation of a registration quality algorithm that is based on the quality of the segment match between two pictures that have supposedly been registered by the computed offsets. If the registration quality algorithm rejects a picture selection, the operator is informed as to which picture or pictures caused the problem, and that picture or pictures can be tried again with different parts of the picture selected for registration points. Thus, if the quality control algorithm rejects a picture because of poor picture selection by the operator (selection of parts of the picture having poor picture detail), the second attempt may result in proper registration and the number of rejects is reduced accordingly.

A final improvement in the invention involves carrying out algorithmic computations while the machine is actually in motion, thereby reducing the machine cycle time and increasing its productivity.

DESCRIPTION OF THE DRAWINGS

In the accompanying drawings which form a part of the specification and are to be read in conjunction therewith and in which like reference numerals are used to indicate like parts in the various views:

FIG. 6 is a diagrammatic illustration depicting an interpolation grid which is used to enhance the accuracy of the algorithmic registration.

DETAILED DESCRIPTION OF THE INVENTION

Construction and Operation of the Registration Machine

In accordance with the present invention, a film registration machine functions to register color film separations. The registration machine is mechanically constructed in the manner disclosed in pending application Ser. No. 099,800, filed on Sept. 22, 1987 by Medioni et al and entitled "Method and Apparatus for Registering Color Separation Film", which application is incorporated by reference herein. The registration machine of the present invention operates in substantially the manner disclosed in application Ser. No. 099,800, except for the different algorithmic processes that are described hereinafter.

The Algorithmic Processes

Figure 1A:
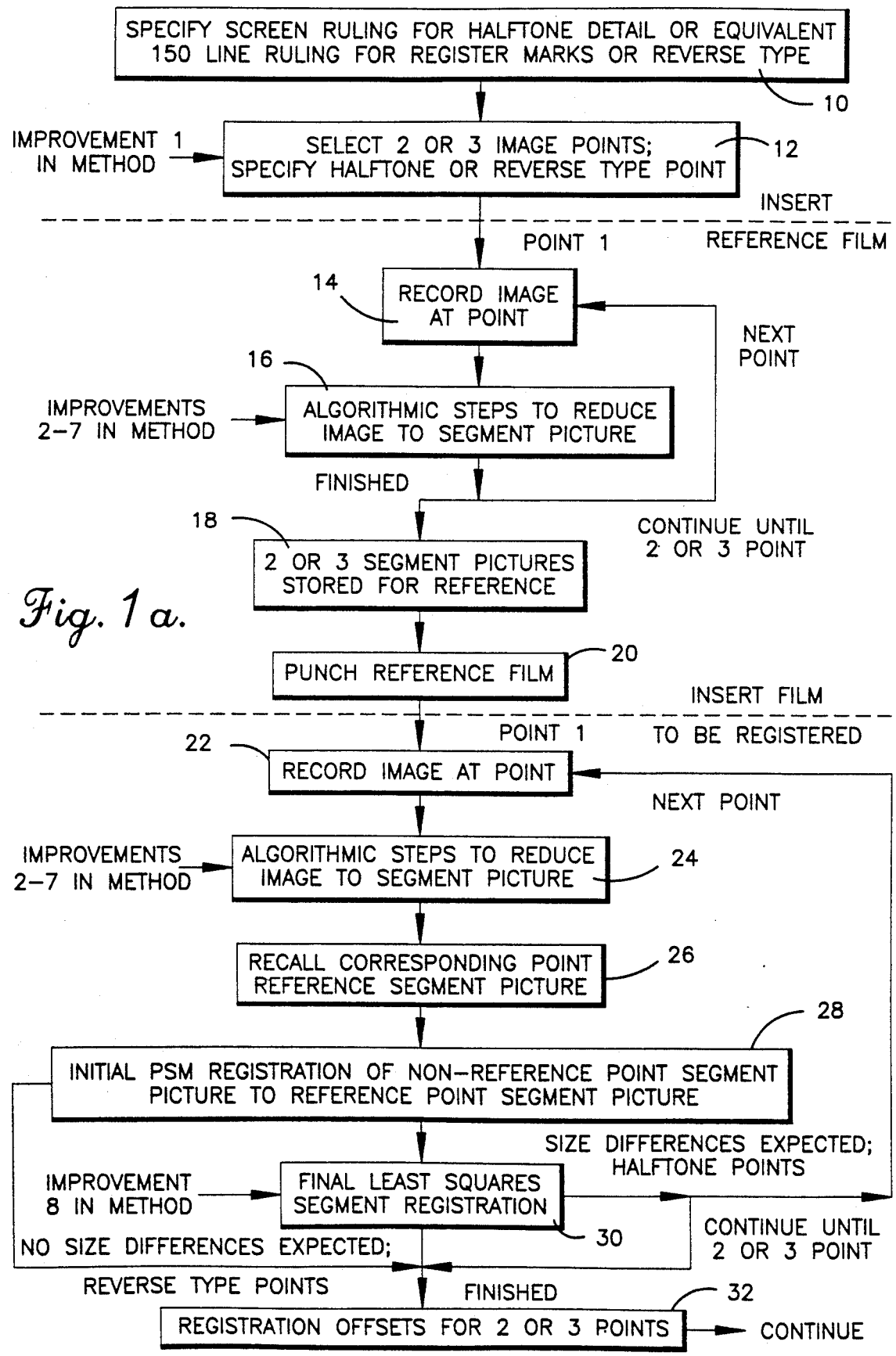
FIGS. 1a, 1b and 1c are flow charts for the algorithmic steps which are performed to effect registration of halftone color film separations in accordance with the method and apparatus of the present invention.
Figure 1B:
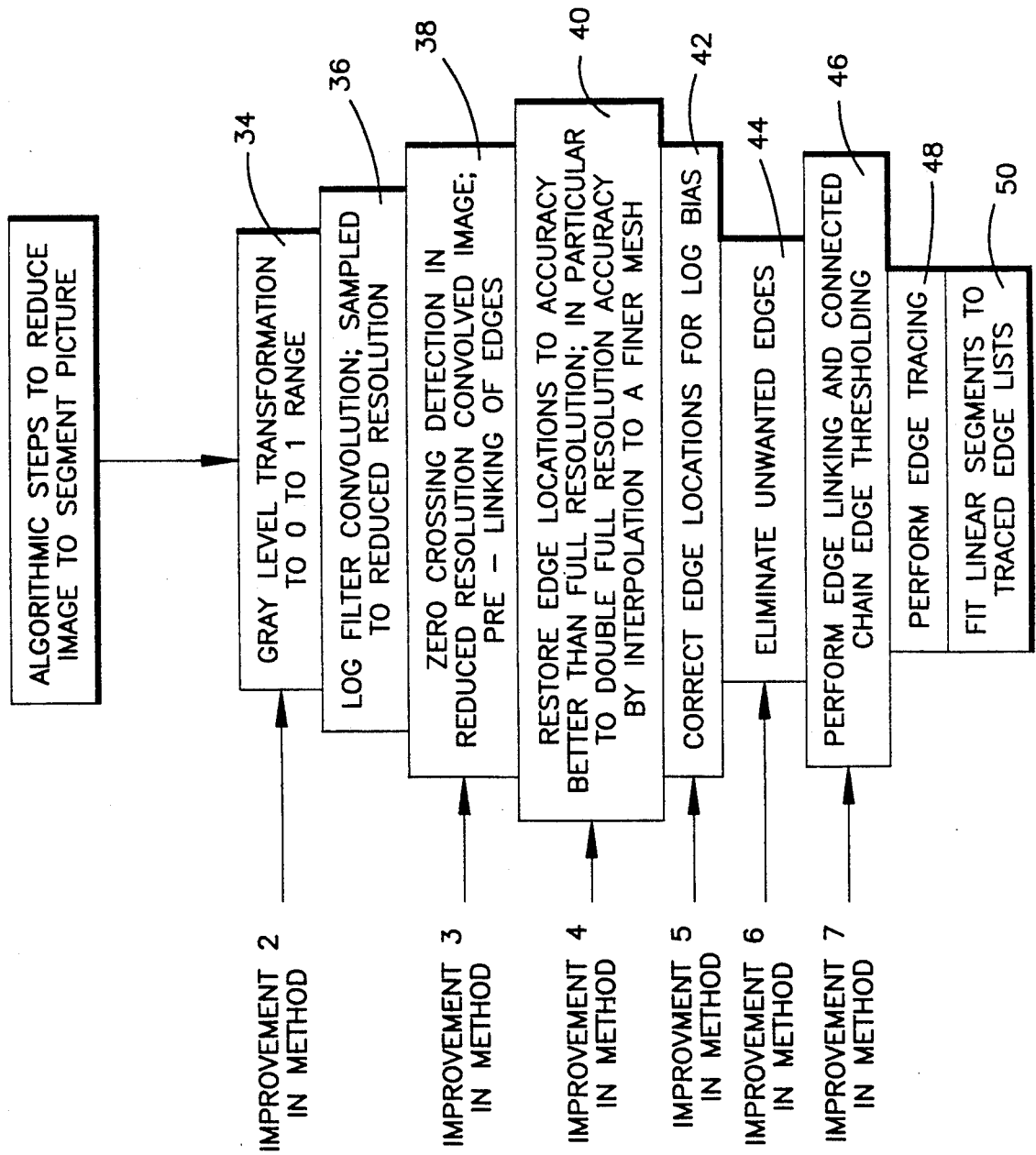
Figure 1C:
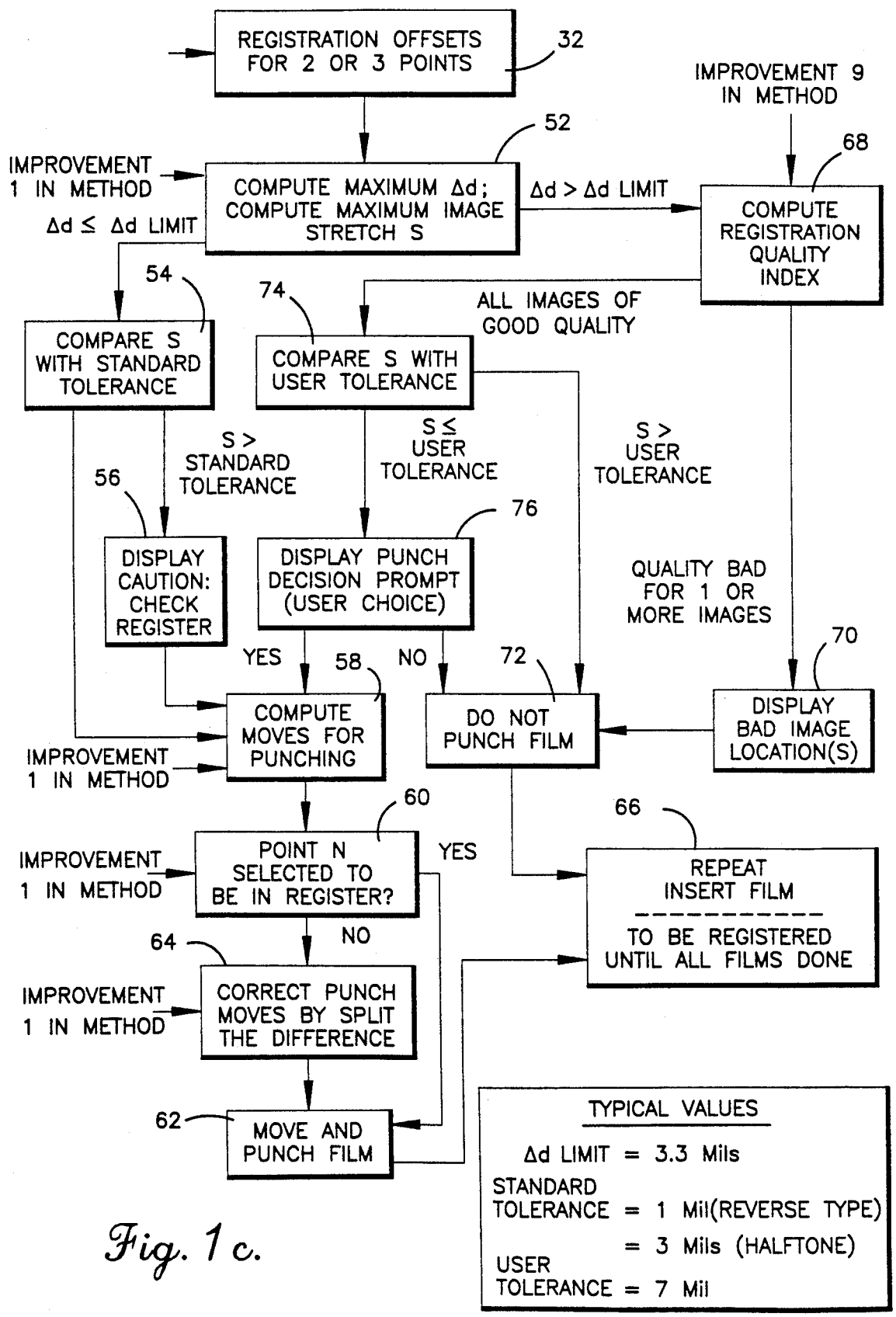

FIGS. 1a, 1b and 1c together provide a flow chart which depicts the algorithmic processes that are carried out by the machine to effect registration of the four color separation films. Referring first to FIG. 1a, screen ruling for the halftone dot detail is specified in block 10. In block 12, either 2 or 3 image points are selected and halftone or reverse type is specified for each image point. After the reference film has been inserted, the images at the selected points are recorded on it as indicated in block 14. Block 16 represents a number of algorithmic steps which reduce each image on the reference film to a segment picture. When the image at the image points have all been processed, the pictures are stored in block 18, and the reference film is punched as indicated in block 20.

The films that are to be registered to the reference film are thereafter inserted sequentially. The images at the registration points are recorded at block 22, and the algorithmic steps are carried out for each film at block 24. The corresponding point on the reference segment picture is recalled at block 26, and initial parameter space method (PSM) registration of each non-reference point segment picture to each reference point segment picture is effected in block 28. If some differences are expected (halftone points), block 30 is entered and final least squares segment registration is carried out. If a reverse type point is involved, no size differences are expected and block 30 is bypassed. The registration offsets block 32 is entered, followed by subsequent operations which will be described more fully with reference to FIG. 1c.

The processes carried out in blocks 10, 14, 18, 20, 22, 26 and 28 are identical to the corresponding processes described in pending application Ser. No. 099,800 which is incorporated herein by reference and to which reference may be made for a detailed description of such processes.

Referring now to FIG. 1b, the algorithmic steps carried out in blocks 16 and 24 involve a gray level transformation in block 34, a log filter convolution in block 36, zero crossing detection in block 38, edge location restoration in block 40, edge location correction for log bins in block 42, elimination of unwanted edges in block 44, edge linking and connected chain edge thresholding in block 46, edge tracing in block 48 and the fitting of linear segments to traced edge lists in block 50. All of these algorithmic steps are performed in a manner generally similar to what is disclosed in application Ser. No. 099,800, with improvements in each step carried out in accordance with the improved algorithmic processes to be described in detail hereinafter.

The registration offsets computations referenced in block 32 are performed in accordance with the flow chart shown in FIG. 1c. In block 52, maximum delta d is computed and the maximum image stretch s is also computed. If the computed delta d limit (typically 3.3 mils), the registration is of good quality and the computed s is compared with a standard tolerance in block 54. If the computed s exceeds the standard tolerance, an advisory message is issued in block 56. Then, block 58 is entered. If the computed s is within the standard tolerance, block 56 is bypassed and block 58 is entered directly from block 54.

In block 58, the punch moves are computed and block 60 is then entered to provide an option either to proceed directly to film punching in block 62 or to effect difference splitting first, in block 64. The film is moved to the proper position and punched in block 62, and block 66 is then entered, calling for insertion of another film and the algorithmic processes until all films have been punched.

From block 52, block 68 is entered in the case where delta d is greater than the delta d limit, and a registration quality index is computed. If one or more pictures exhibit poor quality, block 70 is entered and the location of each poor quality image is displayed for the operator's information. Block 72 is then entered to inhibit punching of the film. If all pictures pass the quality test in block 68, block 74 is entered and the maximum stretch s is compared with a user defined tolerance (typically 7 mil which corresponds to a row of 150 line screen halftone dots). If s exceeds the user tolerance, box 72 is entered and the film is not punched. If s is within the user tolerance, the operator is given a choice in block 76 to punch or not punch. If the punch choice is elected, block 58 is entered and the sequence previously described is followed.

Three Point Registration Method

Figure 2:
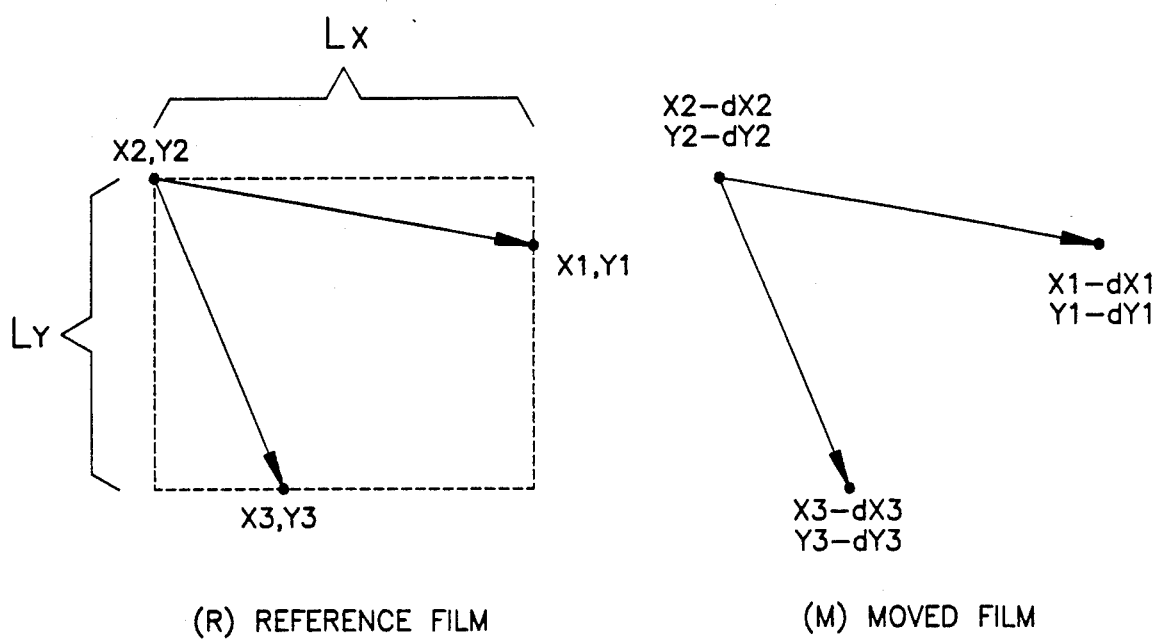
FIG. 2 is a diagrammatic illustration of exemplary three point registration geometry employed by the method and apparatus of the invention.

In accordance with the present invention, each film (the reference film R and all films M which are to be registered to the reference film) may have three registration points selected by the digitizer of the machine. Referring now to FIG. 2, the reference film R is shown with three registration points at locations xi, yi, i=1 to 3. Next to the reference film is the first film to be registered to the reference film (the moved film M). The registration points on the film M are located at xi-dxi,yi-dyi;i=1 to 3, where dxi,dyi are the registration offsets such that by applying a translation dxi,dyi to the ith point of the film M, point i on the film M will move into register or coincidence with the ith point on the reference film R. This ith point is the origin for the final registration transformation, and the origin can be selected at any one of the three points. By convention, the 2nd point will denote the origin point, and FIG. 2 shows one (illustrative) choice of origin. Having moved point 2 on the film M into register with point 2 on the reference film R, the remainder of the registration transformation consists of a rotation about the origin point 2 that brings the directed lines (vectors) from point 2 to the other points into registration.

When three registration points are selected, the registration offsets dxi,dyi are computed for all three registration points in block 32 (FIG. 1a). These offsets are the sum of the initial PSM (parameter space method) offsets and the final least squares offsets if the halftone option was chosen (size differences expected), or the offsets dxi,dyi are the PSM offset alone if the reverse type/register mark option was chosen and block 30 is bypassed. In general, the offsets dxi,dyi will contain both algorithm computational errors (no more than $\frac{1}{4}$ mil in the double accuracy registration method) and any errors due to either image stretching or internal misregister or a combination of both error sources. All sources of error are referred to herein by the term "image stretching", with algorithm errors and internal misregister errors lumped into the computed "image stretching", (when those additional sources of registration error are present).

Image stretching can arise from a variety of sources, but the result of image stretching is that the image on film M is of different global size than the image on the reference film R, with variable size differences in both x and y directions. These global size differences are to be distinguished from the local size differences over small dimensions that are characteristic of the small images recorded in the method and apparatus of the invention. The local size differences are compensated by the final least squares registration step in block 30. Two typical mechanisms that cause global image stretching are the following: (1) the original image on a paper substrate can be scanned to the wrong size in a color separation scanner due to stretching of the substrate around the scanner drum, and (2) the film substrate carrying the final separation images can expand or contract in size, dependent on temperature and humidity. This latter problem is why stripping shops usually carefully control temperature and humidity. One source of high temperature that frequently causes image stretching is the color separation film development and drying process. More infrequently, variable magnification in an optical system exposing copies of color separations can introduce image stretching. Yet another source of image stretching is poor vacuum film pulldown in contact color separation systems.

In accordance with the present invention, the computed registration offsets are input to the final registration process, and improvements in this final process that comprise the three point registration solution are the following:

(1) Computation of the stretching coefficients, thereby providing a complete description of the image stretching;
(2) Computation of the registration angle theta required by the punch hole registration transformation; and
(3) Computation of the split the difference final translation applied to the punch hole registration transformation; if desired as an option, the final split the difference translation can be omitted and the origin point 2 will be in register to within the algorithm error. This option is motivated in practice by a desire of the operator to place some key picture detail in precise register and let the other register points "fall where they may". With this option, the registration has been improved over a two point registration scheme by virtue of a better registration angle theta resulting from the least squares formulation involving all three data points and not just two points.

The punch hole transformation equations to which reference is made above are basic equations which describe the modified punch hole locations (on a film which is to be registered to the reference film) with respect to the punch hole locations on the reference film (thus, reference can be made to relative motion carrying reference punch hole locations to other film punch hole locations), such that the other film is in register with the reference film when both films are laid up on register pins extending through the punch holes.

Figure 3:
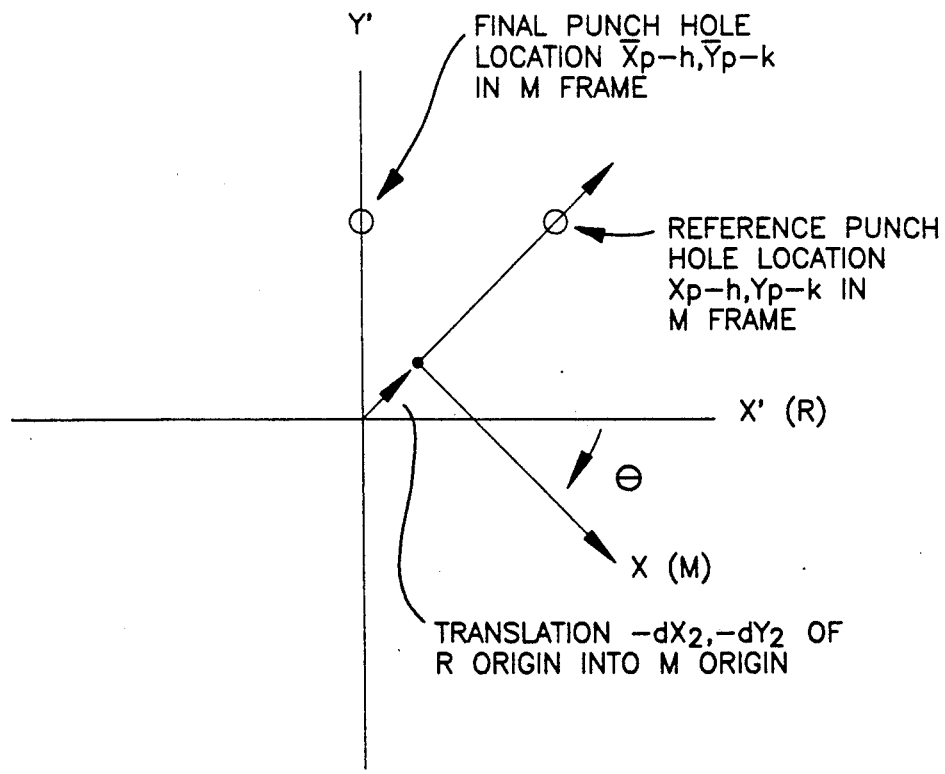
FIG. 3 is a diagrammatic illustration of the geometry of the punch hole registration transformation employed in carrying out the invention.

By way of background, it is pointed out that the punch head is fixed and the motion table moves under it. Thus, a registration transformation carries the M frame into the R frame, but the relative motion of the punch holes is just the opposite, so the punch hole registration transformation carries the R frame into register with the M frame. This is illustrated in FIG. 3 where the prime frame is the R frame and the unprime frame is the M frame. R rotates into M by angle theta which is computed with the proper sign required to rotate the R frame into the M frame. The full punch hole transformation equations are the well known two-dimensional transformation equations describing the transformation from a prime R frame to an unprime M frame:

$$xp = (xp - h - dx_2)\cos\theta - (yp - k - dy_2)\sin\theta + h - Ex \quad (1)$$

$$yp = (yp - k - dy_2)\cos\theta + (xp - h - dx_2)\sin\theta + k - Ey$$

where theta is the registration angle, xp,yp denotes the initial (reference) punch hole location and xp,yp represents the final (registered) punch hole location, and where h=x2, k=y2 (origin) and the difference splitting translation is ex,ey as a registration move, and therefore enters the equations with a minus sign to yield a punch hole movement; $dx_2, dy_2$ is the computed registration offset that moves origin point 2 of the M frame film into register with point 2 of the R frame film $(-dx_2, -dy_2)$ in equations 1 described the opposite transformation of frame R into frame M) The prime frame coordinates in equations 1 are $x' = xp - h - dx_2$ and $y' = yp - R - dy_2$. The other film is in the M frame. Referring to FIG. 3, it is evident that if the transformation of equations 1 are reversed, registration is achieved. If the M origin is translated to the R origin by the offset $dx_2, dy_2$ and if M is rotated theta, the final punch hole location on the other film is put into registration with the reference film punch hole location. There are always at least two punch holes required to preserve registration $(xp_1, yp_1, xp_2, yp_2$ etc.) However, only a single punch hole is shown in FIG. 2 for the sake of simplicity.

The punch hole transformation equations are used in prior techniques; however, the present invention departs from the prior practice in that the angle theta and the difference splittings (ex,ey) are computed with data from three registration points in order to be able to take image stretching in both the x and y direction into account.

A. The Image Stretching Coefficients

Figure 4:
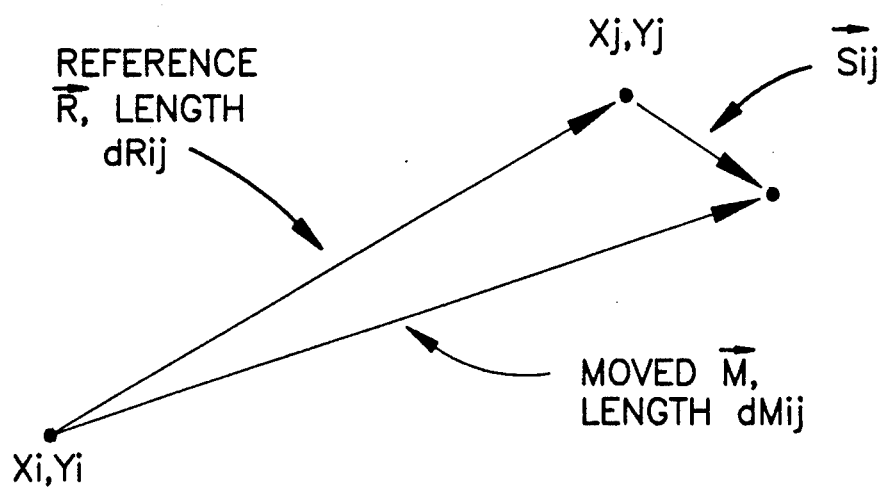
FIG. 4 is a diagrammatic illustration of the image stretching geometry which is employed according to one aspect of the invention.

Because distances are preserved under rotation, a solution for the image stretching can be made in the absence of rotation. FIG. 4 depicts a vector in the reference film R extending from point xi,yi to point xj,yj. The corresponding vector on the moved film M differs from the reference vector by the stretching vector Sij, where in terms of x and y components, the stretching vector is:

$$S_{ij} = S_{xij}x + S_{yij}y \quad (2)$$

The length of the R vector is dRij and the length of the M vector is dMij.

Introducing the stretching coefficients $\alpha x, \alpha y$ (inches/inch), the stretching components can be written as $$S_{xij} = \alpha_x d_{xij} \quad (3)$$

$$S_{yij} = \alpha_y d_{yij}$$

with distances over the stretching in x and y of $$d_{xij} = |x_i - x_j| \quad (4)$$

$$d_{yij} = |y_i - u_j|$$

The unit vector in the direction of the R vector of FIG. 4 is $$N_{Rij} = \cos\theta_{ij}x + \sin\theta_{ij}y \quad (5)$$

where the trigonometric coefficients are $$\cos\theta_{ij} = \frac{x_j - x_i}{d_{Rij}} \quad (6)$$

$$\sin\theta_{ij} = \frac{y_j - y_i}{d_{Rij}}.$$

The vector lengths in FIG. 4 are $$d_{Rij} = \sqrt{(x_j - x_i)^2 + (y_j - y_i)^2} \quad (7)$$

and $$d_{Mij} = \sqrt{[(x_j - x_i) + (dx_i - dx_j)]^2 + [(y_j - y_i) + (dy_i - dy_j)]^2} \quad (8)$$

where dxi,dyi are the ith point offsets and dxj,dyj are the jth point offsets that move vector M into vector R at the ith and jth points, respectively.

The basic equation relating stretching to geometry is that the projection of stretching vector Sij onto the reference vector R must equal the stretch difference in vector lengths when vector M is rotated onto vector R:

$$S_{ij} \cdot N_{Rij} = d_{Mij} - d_{Rij} \quad (9)$$

The latter equation, with prior definitions, expands into $$\alpha_x d_{xij}\cos\theta_{ij} + \alpha_y d_{yij}\sin\theta_{ij} = d_{\mu ij} - d_{Rij} \quad (10)$$

Solving the last equation by a least squares minimization procedure determines the two stretching coefficients.

Thus, forming the least squares measure from equation (10) yields:

$$M = \sum_{\substack{j=1 \\ j \neq 2}}^{N} [\alpha_x d_{x2j}\cos\theta_{2j} + \alpha_y d_{y2j}\sin\theta_{2j} - (d_{M2j} - d_{R2j})]^2 \quad (11)$$

where N is equal to 3. The minimization equations are $\partial M/\partial a_x=0$ and $\partial M/\partial a_y=0$. These equations yield the two equations to be solved for the stretching coefficients, namely $$C_{xx}a_x + C_{xy}a_y = b_x$$

$$C_{xy}a_x + C_{yy}a_y = b_y \quad (12)$$

where the coefficients are $$C_{xx} = \sum_{\substack{j=1\\j\neq 2}}^{N}(d_{x2j}\cos\theta_{2j})^2; \quad b_x = \sum_{\substack{j=1\\j\neq 2}}^{N}(d_{M2j} - d_{R2j})d_{x2j}\cos\theta_{2j} \quad (13)$$

$$C_{xy} = \sum_{\substack{j=1\\j\neq 2}}^{N} d_{x2j}d_{y2j}\cos\theta_{2j}\sin\theta_{2j}$$

$$C_{yy} = \sum_{\substack{j=1\\j\neq 2}}^{N}(d_{y2j}\sin\theta_{2j})^2; \quad b_y = \sum_{\substack{j=1\\j\neq 2}}^{N}(d_{M2j} - d_{R2j})d_{y2j}\sin\theta_{2j}.$$

The solution is $$a_x = (b_x C_{yy} - b_y C_{xy})/D \quad (14)$$

$$a_y = (b_y C_{xx} - b_x C_{xy})/D$$

where determinant D is $$D = C_{xx}C_{yy} - C_{xy}^2. \quad (15)$$

For $N=2$, the determinant vanishes (indeterminate solution). This proves that at least $N=3$ points are required to determine two independent stretching coefficients. More registration points than three can be considered, but extra points would slow the computation. In practice, it is also required to screen the user's selection of three points to reject the situation of three colinear points, also an indeterminate solution. This is accomplished by computing the perpendicular distance of point x3,y3 to the infinite line connecting points 2 and 1. This perpendicular distance $d_\perp$ is $$d_\perp = |ax_3 + by_3 + c|. \quad (16)$$

where the infinite line coefficients are $$a = (y_2 - y_1)/d_{R21}$$

$$b = (x_1 - y_2)/d_{R21}$$

$$c = (y_1 x_2 - x_1 y_2)/d_{R21} \quad (17)$$

If $d_\perp$ is less than 0.125 inch, the point selections are rejected and another selection is called for.

The Transformation Angle Theta

The starting point for computing the transformation angle theta is the punch hole transformations of, (1) written without differences splitting as $$x = x'\cos\theta - y'\sin\theta + h$$

$$y = y'\cos\theta + x'\sin\theta + k \quad (18)$$

where $$x' = x - h - dx_2; \quad h = x_2$$

$$y' = y - k - dy_2; \quad k = y_2 \quad (19)$$

and dx2,dy2 are the registration offsets for the origin point 2x. x,y is an original punch hole location in the unprime frame and $\bar{x},\bar{y}$ is the final punch hole location also in the unprime frame. These equations can be applied to the registration points themselves, so long as it is remembered that registration carries moved M frame into reference R frame, but the punch hole transformation equations carry R into M as previously indicated.

The registration R points are $$(xyi, yri); \quad i = 1 \text{ to } N. \quad (20)$$

Since REFERENCE=MOVED+OFFSET, the registration M points are $$xmi = xri - dxi$$

$$ymi = yri - dyi \quad (21)$$

where dxi,hyi are the ith point registration offsets carrying M into R at point i. The stretching from the origin to the ith point has the components $$S_{xi} = a_x D_{xi} \quad (22)$$

$$S_{yi} = a_y D_{yi}$$

where the stretching lengths are $$D_{xi} = |x_i - x_2| \quad (23)$$

$$D_{yi} = |y_i - y_2|$$

Rotation is not invariant to stretching in general (it happens to be invariant for the case of magnification, i.e. equal stretch in both directions), hence stretching must be removed from the M coordinates:

$$x_{mi} = x_{ri} - d_{xi} - S_{xi} \quad (24)$$

$$y_{mi} = y_{ri} - d_{yi} - S_{yi}$$

The transformation (18) will carry Xr,Xy into Xm,Ym, so the equations can be written as $$x_{mi} = (x_{mi} + d_{xi} + S_{xi} - h - d_{x2})\cos\theta - \quad (25)$$
$$(y_{mi} + d_{yi} + S_{yi} - k - d_{y2})\sin\theta + h$$

$$y_{mi} = (y_{mi} + d_{yi} + S_{yi} - k - d_{y2})\cos\theta +$$
$$(x_{mi} + d_{xi} + S_{xi} - h - d_{x2})\sin\theta + k.$$

It is convenient to define the following variables:

$$\Delta_{xi} = d_{x2} - d_{xi} \quad (26)$$

$$\Delta_{yi} = d_{y2} - d_{yi}$$

$$\Delta_{xoi} = x_{mi} - h$$

$$\Delta_{yoi} = y_{mi} - k.$$

With these variables, equations (25) become $$\Delta_{xoi} = [\Delta_{xoi} - (\Delta_{xi} - S_{xi})]\cos\theta - \{\Delta_{yoi} - (\Delta_{yi} - S_{yi})\}\sin\theta \quad (27)$$

-continued $$\Delta_{yoi} = [\Delta_{yoi} - (\Delta_{yi} - S_{yi})]\cos\theta + \{\Delta_{xoi} - (\Delta_{xi} - S_{xi})\}\sin\theta.$$

From equation (27), the least squares measure S can be set up:

$$S = \sum_{\substack{i=1 \\ i \neq 2}}^{N} \left\{ \begin{array}{l} [(\Delta_{xoi} - (\Delta_{xi} - S_{xi}))\cos\theta - (\Delta_{yoi} - (\Delta_{yi} - S_{yi}))\sin\theta - \Delta_{xoi}]^2 + \\ [(\Delta_{yoi} - (\Delta_{yi} - S_{yi}))\cos\theta + (\Delta_{xoi} - (\Delta_{xi} - S_{xi}))\sin\theta - \Delta_{yoi}]^2 \end{array} \right\}. \quad (28)$$

The solution from $\partial S/\partial \theta = 0$ is $$\tan\theta = \quad (29)$$

$$\frac{\sum_{\substack{i=1 \\ i \neq 2}}^{N} -[\Delta_{yoi}(\Delta_{xi} - S_{xi}) - \Delta_{xoi}(\Delta_{yi} - S_{yi})]}{\sum_{\substack{i=1 \\ i \neq 2}}^{N} [\Delta_{xoi}(\Delta_{xoi} - (\Delta_{xi} - S_{xi})) + \Delta_{yoi}(\Delta_{yoi} - (\Delta_{yi} - S_{yi}))]}$$

$$\theta = \tan^{-1}[\tan\theta].$$

C. The Final Difference Splitting

The solution so far is in register at the origin and in error at the other points dependent on the size of the stretching in x and y. The buildup of stretching from the origin to each point creates an error $S_{xi}, S_{yi}$ at the ith point. To compensate for this error and split the difference, one can determine a final, uniform translation ex,ey that minimizes the error measure E:

$$E = \sum_{i=1}^{N} [(S_{xi} + \epsilon_x)^2 + (S_{yi} + \epsilon_y)^2]. \quad (30)$$

The solution to $\frac{\partial E}{\partial \epsilon_x} = o$ and $\frac{\partial E}{\partial \epsilon_y} = o$ are the splittings $$\epsilon_x = -\frac{1}{N}\sum_{i=1}^{N} S_{xi}, \epsilon_y = -\frac{1}{N}\sum_{i=1}^{N} S_{yi}. \quad (31)$$

This result does not meet the requirements of stripping professionals who desire a splitting that is equal and opposite at the extreme registration points in both x and y. The result (31) does not guarantee such extreme splitting, unless it is modified so that the sums run only over the extreme points in x and y. The solution to the modified least squares problem yields a very simple result:

$$\epsilon_x = -\tfrac{1}{2} a_x L_x \quad (32)$$

$$\epsilon_y = -\tfrac{1}{2} a_y L_y$$

where Lx and Ly are the side lengths of a box minimally confining all points, as illustrated in FIG. 2.

In the case of true image stretching that linearly builds up over the image, the registration error (ignoring algorithm error) moved-reference, as observed on a real film pair with image stretching, is given by $$\text{observed error } (M-R)(x) = \epsilon_x + a_x|x - x_{min}| \quad (33)$$

$$\text{observed error } (M-R)(y) = \epsilon_y + a_y|y - y_{ext}|$$

where max and min are the respective maximum and minimum coordinates of the confining box and the extreme y value is that extreme closest to the origin:

$$y_{ext} = y_{min}; y_2 \leq \tfrac{1}{2}(y_{min} + y_{max})$$

$$y_{ext} = y_{max}; y_2 > \tfrac{1}{2}(y_{min} + y_{max}) \quad (34)$$

It is assumed in equation 33 that origin x2,y2 is chosen as the leftmost point, for simplification. This convention is always used when difference splitting is to be performed. For the option of preferential register at any one of the three points the origin can be taken to be the preferential point. The error formula is "exact" for the case of true image splitting, since it predicts equal and opposite errors at the extreme points and 0 error exactly midway between the extremes, where one half of the full stretch buildup cancels off the split at the starting end. At the other end, the full stretch buildup adds to the start end split to reverse its sign. This is what is observed on actual stretched films. For a film with true image stretching, the 0 error point can be shifted to any desired interior point by modifying the splittings to $$\epsilon_x \rightarrow F_x \epsilon_x \quad (35)$$

$$\epsilon_y \rightarrow F_y \epsilon_y$$

where the proportionality factors Fx,Fy come from the conditions $$0 = F_x \epsilon_x + \epsilon_x|x_c - X_{min}| \quad (36)$$

$$0 = F_y \epsilon_y + \epsilon_y|y_c - y_{ext}|$$

where xc,yc is the desired center point. The result for the factors is $$F_x = \left(\frac{2}{L_x}\right)|x_c - x_{min}| \quad (37)$$

$$F_y = \left(\frac{2}{L_y}\right)|y_c - y_{ext}|.$$

These factors are unity for xc,yc midway between the extremes.

D. Predicted Registration Errors and a Final Splitting Correction

It is possible to generalize equation (33) to produce a general formula, for the registration errors at each point, that includes all sources of error. Evidently, registration error is the difference between moved coordinates of equation (24) and the final coordinates of equation (1) that describe the moved frame result after registration has been performed. Further adding in the image stretch buildup of equation (33), the resulting error formula from equations (1, 22, 23, 24, 29, 32 and 34) at the ith registration point, for residual errors erxi,eryi is $$e_{rxi} = x_{ri} - d_{xi} - S_{xi} + a_x |x - x_{min}| - \quad (38)$$

$$[(x_{ri} - x_2 - d_{x2})\cos\theta - (y_{ri} - y_2 - d_{y2})\sin\theta + x_2 - \epsilon_x]$$

$$e_{ryi} = y_{ri} - d_{yi} - S_{yi} + a_y |y - y_{ext.}| -$$

$$[(y_{ri} - y_2 - d_{y2})\cos\theta + (x_{ri} - x_2 - d_{x2})\sin\theta + y_2 - \epsilon_y].$$

When formula (38) is applied to compute the residual errors, it is discovered that the splitting is not always exactly equal and opposite, due to all sources of error, but it is typically close to equal and opposite to within about ½ mil. But, since it is explicit from formula (38) what the final errors are, a final correction can be made to the splitting ex,ey of equation (32) to produce film splittings that are exactly equal and opposite, with mechanical apparatus errors ignored. The final correction is $$ex(\text{final}) = ex(\text{initial}) - \tfrac{1}{2}(erxI + erxJ) \quad (38b)$$

$$ey(\text{final}) = ey(\text{initial}) - \tfrac{1}{2}(eryK + eryL)$$

where ex,ey initial is the equation (32) result. erxI,erxJ are the residual x errors from equation (38) at the Ith and Jth registration points that have an equal and opposite split x error between them. Similarly, eryK,eryL are the residual y errors from equation (38) at the Kth and Lth registration points that have an equal and opposite split y error between them. Using ex,ey final from equation (38b) in equation (38) results in predicted errors for splitting pairs of points that are exactly equal and opposite. These corrected residual errors can be displayed for the machine operator as a guide to what splitting and errors to expect when examining the film registration.

E. Validity of the Image Stretching Model as Applied to Internal Misregister The three point registration solution has been deliberately constructed to be as exact as possible for the case of true image stretching on single piece films (an important class of problem films). It has been verified empirically that the three point registration solution also gives acceptable results when applied to films where the principal error is due to internal misregister between multiple image elements on the composed film. Although only three image elements can be put into approximate register, these can be the three most important elements on the page, and this is a considerable improvement over a restriction allowing only two elements to be put in approximate register.

With true image stretching the dominant error will always be between the extreme points in x and y and the splitting will consequently always be between the two pairs of extreme points. Applying the image stretching model to internal misregister results in a more general situation in which the dominant error can lie between two non-extreme points and the consequent splitting can also be between two nonextreme points. Equation (38) shows why the solution has more general validity when applied also to internal misregister. The reason is that the stretching terms involving the stretching coefficients cancel out of formula (38) between the origin point 2 and the registration point of interest, leaving the dxi,dyi offsets to carry the error information. But the dxi,dyi offsets are not restricted to build up linearly over the picture; consequently, the solution has more general validity in the internal misregister case where errors do not necessarily build up linearly over the image. In the case of internal misregister, the stretching coefficients are effective coefficients normalized so that multiplication by the extreme lengths produces the dominant internal misregister errors between any two points, not necessarily between the extreme points. The splitting computed from the effective stretching coefficients then correctly splits the error, wherever it occurs. The distribution of the error however, is controlled by the offsets dxi,dyi and they can vary between points in a manner not restricted to linear growth of image stretching.

Figure 5:
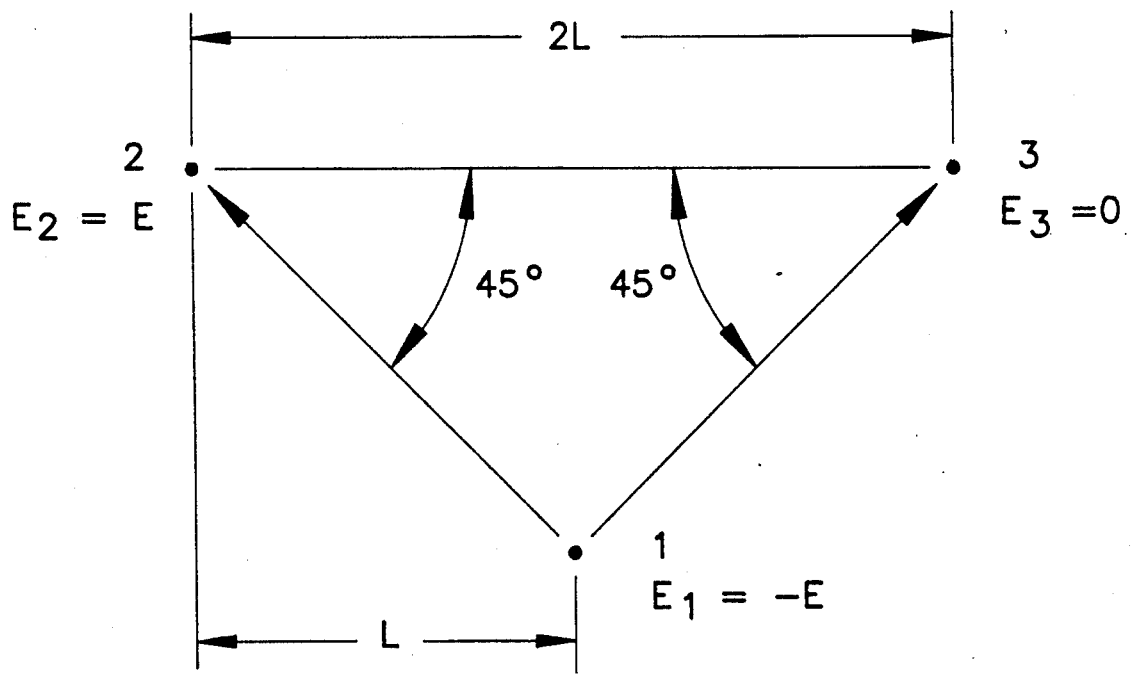
FIG. 5 is a diagrammatic illustration of the geometry for simplified internal misregister computations.

An example is helpful to illustrate the more general splitting possible in the case of internal misregister. FIG. 5 shows a three point registration example with internal misregister in which the two images are in best register with point 3 in register (zero error) and an error e split equally and oppositely between two non-extreme points 1 and 2. To simplify the example, the rotation can be taken as zero and only x error can be assumed (as is the case in FIG. 5). Thus equation (38) in x simplifies to $$erxi = dx2 - dxi + ex \quad (38c)$$

For the example of FIG. 5, $dxi = ei$ and the image stretching coefficient is the maximum error distributed over the total length or $(e2-e1)/(2L)$; hence, splitting ex from equation (32) yields $$ex = -(\tfrac{1}{2})(2L)(e2-e1)/(2L) = -(\tfrac{1}{2})(e2-e1) \quad (38d)$$

The error formula (38) then correctly predicts all of the errors in FIG. 5, namely $$erx1 = e2 - e1 - (e2-e1)/2 = (e2-e1)/2 = -e$$

$$erx2 = e2 - e2 - (e2-e1)/2 = -(e2-e1)/2 = +e \quad (38e)$$

$$erx3 = e2 - e3 - (e2-e1)/2 = -e - 0 - (-e-e)/2 = 0$$

To modify the FIG. 5 example to image stretching, one can take $e1=0$, $e2=e$, $e3=-e$. Since dxi carries the stretching buildup, $dx2=0, dx1=e$ and $dx3=2e$ stretch buildup from left to right. Then $$ex = -(\tfrac{1}{2})(2L)(dx3-dx2)/(2L) = +e \quad (38f)$$

The error formula (38) again correctly predicts the errors:

$$erx1 = dx2 - dx1 + e = 0 - e + e = 0$$

$$erx2 = dx2 - dx2 + e = +e \quad (38g)$$

$$erx3 = dx2 - dx3 + e = 0 - 2e + e = -e$$

The last two examples show clearly how dxi carries the error information and thereby controls the splitting. The situation is analogous for y splitting. Thus, the model developed to be exact for true image stretching can also be applied to the case of internal misregister to produce a pleasing compromise registration, as verified empirically from the judgments of professional strippers examining films registered by the present invention method applied to instances of internal misregister.

What has been described thus far is the angle theta (equation 29) and the difference splittings (equation 38b using equation 32) which are used in the punch hole transformation equations 2. Equations 1, with ex,ey of equations 38b and 32 ignored, provide the computed punch moves of block 58 (FIG. 1c). The punch move correction indicated in block 64 of FIG. 1c is the correction that results when ex and ey of equations 38b and 32 are not ignored in equations 1. Block 60 provides the option to not invoke the difference splitting correction, and block 64 is bypassed if such option is exercised.

F. The Optimum Two Point Registration Method

The correct three point solution shows that both $\alpha_x$ and $\alpha_y$ cannot be independently determined with just two points. Thus, for two points, the possibilities are (1) a magnification model in which $\alpha_x = \alpha_y$, a single coefficient, or (2) a one-dimensional model in which either $\alpha_x$ or $\alpha_y$ is 0 and again one coefficient remains. The stretchings Sx,Sy (equal to −2 x the splits) are given by $$Sx = (dm - dr)\cos(theta) \quad (39)$$

$$Sy = (dm - dr)\sin(theta) \quad (40)$$

Inserting these stretching into the basic equation (10) yields $$Sx\cos(theta) + Sy\sin(theta) = dm - dr \quad (40)$$

and the equation is exactly satisfied for the special case in which $$\alpha_x = \alpha_y = (dm - dr)/(2dr) \quad (41)$$

Experience has revealed that the equal stretching coefficient assumption of the two point magnification model is not a good assumption for the majority of actual films with image stretching. A better assumption is the other possibility for a two point solution, namely, the one-dimensional model with one or the other stretching coefficient=0.

Using notion consistent with the present invention, the one-dimensional model is aided by the following variables $$\Delta x_0 = x_1 - x_2 \quad (42)$$
$$\Delta y_0 = y_1 - y_2$$
$$\Delta x = dx_2 - dx_1$$
$$\Delta y = dy_2 - dy_1.$$

The lengths of the R and M vectors are $$d_R = \sqrt{\Delta x_0^2 + \Delta y_0^2} \quad (43)$$

$$d_M = \sqrt{(\Delta x_0 + \Delta x)^2 + (\Delta y_0 + \Delta y)^2}.$$

Without stretching, dr=dm. By assumption, the non-zero stretching is solved in the dominant separation distance (x or y) between the two registration points. There are two cases:

case 1—x stretch ($|\Delta_{xo}| \geq |\Delta_{yo}|$)

The input data with stretching ignored is $$\Delta y_d = dy_2 - dy_1 \quad (44)$$

From the algebraic solution to the equation dr=dm, the corresponding $\Delta xu = \Delta x$ in the absence of stretch is $$\Delta x_u = \frac{-\text{sign}(b)2C}{|b| + \sqrt{b^2 - 4C}} \quad (45)$$

where $$b = 2\Delta x_o \quad (46)$$

$$c = 2\Delta x d \Delta y_o + \Delta y d^2.$$

The stretching for case 1 is $$Sx_1 = dx_2 - dx_1 - \Delta x_u \quad ; \quad \epsilon x = -\frac{Sx_1}{z} \quad (47)$$
$$Sy_1 = 0 \quad ; \quad \epsilon y = 0.$$

case 2—y stretch ($|\Delta_{yo}| > |\Delta_{xo}|$)

The input data with stretching ignored is $$\Delta x_d = dx_2 - dx_1. \quad (48)$$

From the algebraic solution to the equation dr=dm, the corresponding $\Delta yu = \Delta y$ in the absence of stretch is $$\Delta y_u = \frac{-\text{sign}(b)2C}{|b| + \sqrt{b^2 - 4C}} \quad (49)$$

where $$b = 2\Delta y_o$$

$$c = 2\Delta x_d \Delta x_o + \Delta x_d^2. \quad (50)$$

The stretching for case 2 is $$Sx_1 = 0 \quad ; \quad \epsilon x = 0 \quad (51)$$
$$Sy_1 = dy_2 - dy_1 - \Delta y_u \quad ; \quad \epsilon y = -\frac{Sy_1}{z}.$$

The three point theta result of equation (29), applied to a two point registration with N=2, is an improvement over the result achieved using prior techniques since both stretching components are known by virtue of the one-dimensional model assumption. Thus, the optimum two point registration method uses the stretch components and splits given in equation (47) and (51), and the transformation angle theta from equation (29), evaluated for N=2 points. This constitutes the two point registration method of the present invention.

The Improved Gray Level Transformation

The first step in the algorithmic process begins once a gray level (0–225) digital picture (640×640 pixels) is acquired. The gray levels of each picture are transformed by the following linear transformation:

$$G(\text{final}) = [G(\text{gray}) - G(\text{min})]/[G(\text{max}) - G(\text{min})] \quad (52)$$

where the final digital picture tone is G(final) and the initial gray level tones are G(gray). The max and min values are the maximum and minimum gray levels in the picture. Evidently, as G(gray) varies from G(min) to G(max), G(final) varies from 0 to 1. The gray levels over 0 can be mapped to any number, but for computational accuracy in single precision(32 bit) arithmetic, the number one is ideal (numbers near unity offer the greatest protection from roundoff error when many multiplications and additions are made in the edge detection convolutions. The gray level tone not just equal to 0 or 1, but with variation in between 0 and 1 is significant improvement over the prior optimal thresholding technique. The result of the G(final) is that the method and apparatus of the present invention is able to successfully register images with some degree of edge blurring or fuzziness that previously would have been rejected by quality control measures Pictures that are blurry in the extreme are still rejected, but the degree of fuzziness allowed in the edge detail is greater in the present invention than in previous practice Physically, the improvement is a result of a better modeling of the tone density variations (able to represent more subtle variations) which determine edge locations via the log convolution filter zero crossings. Binary thresholding represents a loss of information which only degrades the performance of the prior method.

Use of the gray level method does rely on the fact that the digital camera light source has been adjusted for uniform lighting over the field of view. Under certain adverse conditions, non-uniform lighting could introduce spurious gray level variations and some degradation of the detected edges. With current light source and adjustment techniques, it is not believed that any problems due to light source non-uniformity will be encountered. The current method of light source adjustment utilizes a reduced resolution grid obtained from the original 640×640 picture, namely a 16×16 grid of average gray levels displayed after a trial scan with no film (no image). Adjusting the light source to make the 16×16 grid of mean gray levels as uniform as possible is a satisfactory method for light source uniformity calibration. If care is not taken to adjust the light source for uniformity, a gray level method can produce results that are inferior to those utilizing the thresholding method. In fact that was one of the reasons that the thresholding methods has been used in past practice Camera electronics noise can adversely effect the gray levels. However, this has been found not to be the case in the method and apparatus of the present invention, especially when noise reduction countermeasures (hardening) are implemented to reduce overall system noise. Prior practice has proceeded on the basis that the weakness of the thresholding method with respect to individual dot edge resolution does not adversely effect the registration accuracy This is true for sharper edge detail, but it fails to take into account the improvement that has been observed in the registration of pictures with some degree of edge blurring, as a result of being able to resolve more subtle tone density variations with the gray level transformation method used in practicing the present invention.

The Improved U.S.C. Predicate for Edge Detection

In pending application Ser. No. 099,800, the algorithm used to find edge locations and directions in the reduced resolution convolution output is referred to as the U.S.C. predicate. This predicate algorithm has recently been refined and extended to include a pre-linking step that finds a best successor edge that the current edge points directly to and a best predecessor edge (one) that points directly to the current edge. The improved algorithm is the U.S.C. predicate as described in the U.S.C. IRIS laboratory report #252 entitled "Accurate Detection and Linking of Zero-Crossings", by S. Gazit and G. Medioni. The refinement of the predicate algorithm consists of deriving the predicate rules for recognizing edge locations and directions from first principles, rather than from heuristic rules.

This improved U.S.C. detection algorithm is known to those skilled in the art of edge detection, and its manner of application in the present invention is described specifically by the FORTRAN computer program listing which is identified as Appendix A to this application. Subroutine E3egm prepares the way for applications of the predicate rules in subroutine E3dzc. Subsequently, subroutines E7mbi2 and E3mlnk perform the pre-linking step. Subroutine DIFF is a mathematical function used in the pre-linking.

Double Accuracy Registration

Using the steps in the prior technique for obtaining a decimated convolution and applying the U.S.C. edge detection method, the result is edge locations lying on pixels of the ⅛ resolution decimated convolution output. The original resolution edge locations are then found by erecting an interpolation grid centered on an original resolution edge location pixel, with grid spacing ⅛ of the pixel separation of the decimated convolution. The 289 fine grid point locations are then searched for the minimum interpolated magnitude of the convolution response (zero crossing), and this single fine grid point location is the (sampled) location of the edge point accurate to the nearest ¼ mil pixel (original resolution).

In accordance with the present invention, the method restores the edge location to an accuracy that exceeds the original resolution, and in particular to double accuracy or twice the original resolution by interpolating to grid points that lie on a grid of spacing 1/16 in the neighborhood of the ⅛ spacing grid point selected as the original resolution edge location. Thus, rather than waste valuable computation time creating an entire 1/16 spacing grid to replace the ⅛ spacing grid, it is only necessary to erect a local 1/16 spacing grid about the ⅛ spacing grid point chosen as the original resolution edge location, as show in FIG. 6. The interpolated values are then searched for a minimum convolution response magnitude over the circled points to find a double accuracy edge location to the nearest 1/16 grid spacing or to the nearest ¼ mil pixel. The remaining algorithmic method steps are the same as those of pending application Ser. No. 099,800 but executed with edge locations accurate to the nearest ¼ mil pixel. In particular, the size of the accumulator space in the PSM registration step is now twice as large since the accumulator gird is in ¼ mil pixel, and the PSM best registration offset peak is found to the nearest ¼ mil pixel.

To be certain that the interpolation method will support a factor of 16 increase in interpolated resolution restoration, it is noted that it is known that a zero crossing can be more accurately determined than, for example, a function peak. To show this, some simple models can be used. To determine a peak value of a normalized Gaussian G(u) (peak=1 at u=0), $$G(u) = \exp\left[-\frac{u^2}{2\sigma^2}\right] \tag{53}$$

and sigma is about 16 for ½ mil pixels in the algorithmic method. Within a small neighborhood du near the true peak value at u=0, a peak is sought over interpolated values. Setting the small difference G(u+du)−G(u) to the absolute error estimate of the interpolation method (here, about 0.003 for the cubic spline interpolation method disclosed in application Ser. No. 099,800) results in $$\frac{du^2}{2\sigma^2} = .003 \quad (54)$$

Solving for du yields a result of about 1.3, not even accurate to 1 pixel, let alone a fraction of a pixel, at the limit of the interpolation to resolve peak locations. Fortunately, the situation is dramatically different for a zero crossing.

A model for the application zero crossing can be erected by a normalized Gaussian derivative, GD(u) namely $$GD(u) = \frac{u}{\sigma} e^{\frac{1}{2}} e^{-\frac{u^2}{2\sigma^2}} \quad (55)$$

Again, equating the small difference GD(u+du) to the interpolation error yields $$\Delta GD \approx \frac{(du)e^{\frac{1}{2}}}{\sigma} = .003 \quad (56)$$

Solving for du yields a value of about 0.03, or 3% of a ½ mil pixel spacing. But the double accuracy method is asking only for accurate determination to within ½ or 50% of a ½ mil pixel spacing. Clearly, there is accuracy to spare in the method, and a crude measure of "signal to noise" ratio is 0.5/0.03 or about 16. The interpolation method is not even near the limit of resolution when locating the edge location to the nearest ¼ mil pixel. Thus, the present invention method could be extended to even more accurate determination of edge location, say to ⅛ mil pixels, and still be comfortably removed from the "noise limit" of resolution.

There is, however, a computational time penalty for the more accurate interpolation in the later step of erecting a more accurate grid for the PSM accumulator space. With ¼ mil pixels, the accumulator space is doubled in size and the time penalty is still acceptable. With ⅛ mil pixels, the accumulator space would be quadrupled in size and the time penalty is normally too great to accept with current computational speeds. In the future, with more powerful, yet cost effective computers available, the method may be upgraded to ⅛ mil pixel resolution. The ¼ mil (double accuracy) registration accuracy coupled with an apparatus accuracy of also ¼ mil yields a system that shows no greater than ½ mil errors in final registered films with sharp edged detail. Such accuracy is acceptable to professional strippers.

The double accuracy method has been tested by operating the machine in the so-called self-test mode in which a register mark (sharp edged) picture is repeatedly registered to itself and the offsets are recorded. For the most part, the recorded offsets are dominated by zero, with + and −¼ mil errors next in frequency and an occasional ½ mil error due to motion table repeatability errors as great as a couple of tenths of a mil conspiring with a ¼ mil algorithm error to produce a larger error. The quantized errors of 0, +/−¼ and ½ mil arise from the PSM registration output only, in the case of reverse type or register marks in which the final least squares segment registration step is not applied. Similar results, but with non-quantized errors result from operating in the self-test mode with the final registration step applied, as would be the case for halftone detail.

The most stringent test of the double accuracy registration method however, is the actual punched registration of films with register mark targets (crosshairs) containing a one mil diameter dot in one crosshair quadrant. With the aid of a microscope reading to tenths of a mil and by observing the registration error in the one mil dot position shift the registration error can be read as the result 0,+−¼,½,¾ by way of closest visual estimation. For hundreds of registered films, testing has revealed errors no greater than +/−½ mil with either the PSM registration step along (nominally for reverse type and register marks) or with the PSM step followed by the final least squares segment registration step (nominally for halftones). Hundreds of halftone images have also been registered with the full registration steps, and the registration accuracy has been deemed acceptable by strippers trained to judge halftone register (a difficult task for the unskilled observer).

Finer Angle Sweeping

As previously indicated, the edge bias correction step can be improved by varying the normal in relatively fine steps of 22.5° each. Smoother edge transitions around sharp corners result, and the improved results more than compensate for the added computation time that is required.

Unwanted Edge Removal

In the technique disclosed in pending application Ser. No. 099,800, unwanted edges are removed by both thresholding criteria and by a physical edge criterion. In the present invention, only the physical edge criterion is applied prior to the final edge linking step, and its application is disclosed in the referenced application. The thresholding criteria are later applied in a modified way during the final linking step, as will be explained more fully.

Edge Linking and Chain Edge Thresholding

The final edge linking is simplified by the edge location direction pointers resulting from the pre-linking steps which has already been described. Since connected chains can be easily recognized at this stage, the final step in the final edge linking is the removal of unwanted chains of edges that comprise a set of edges, each of which is a candidate for rejection according to the thresholding criteria described in application Ser. No. 099,800.

Improved Final Least Squares Segment Registration

In application Ser. No. 099,800, the final least squares registration offset followed from solution of an equation (identified therein as equation 69) to tx,ty and omega. In the present invention, the omega rotation parameter is eliminated from the outset and the entire derivation is straightforwardly repeated to again yield a similar equation to be solved, for offsets tx,ty, namely $$(\Sigma Q_2)\begin{pmatrix} tx \\ ty \end{pmatrix} = (\Sigma V) \quad (57)$$

In equation (57) Q2 is a 2×2 matrix and V is a 2×1 column vector. Both matrices are identified from a 3×3 version of equation (68) of application Ser. No. 099,800 that results from the new derivation with omega eliminated.

The second least squares improvement is the addition of weighting factors in the summations of (57), so that the equation to be solved for least squares registration offsets tx,ty is now $$(\Sigma W_K Q_2)\begin{pmatrix} tx \\ ty \end{pmatrix} = (\Sigma W_K V) \tag{58}$$

The weighting factors are the segment overlap for the kth segment pair after the moved segment 2 is translated by the PSM registration offset into initial register with the reference segment 1. Thus, the most important contributors to (58) are those segment pairs that overlap the most. This improvement tends to reduce the instances of difficulty in registration due to the contributions of segment pairs that do not match well. In particular, the prior practice is subject to difficulty registering crosshair register marks using the final least squares registration algorithm (normally not done when no size differences are present). The improvement of weighting makes the least squares algorithm highly accurate when applied even to crosshair register marks. Apparently, difficulty registering the crosshair register mark in the prior practice is attributable to the long segments in that case that "match" with a small overlap to a distant segment.

The weighting factor for the kth segment pair contribution to the summations in equation (58) is Wk where the overlap is Ov and $$Ov = \tfrac{1}{2}(1R + 1M) - D \tag{59}$$
$$Wk = Ov; \; Ov \geq 0$$
$$= 0; \; Ov < 0$$
$$= \text{MINIMUM}(1R,1M); \; Ov > \text{MINIMUM}(1R,1M)$$

where D is the perpendicular distance from the M segment center xc2,yc2 moved into initial registration by registration offsets XPSM, yPSM, to a line perpendicular to the R segment at that segment at that segment center:

$$D = |a(x_{c2} + X_{PSM}) + b(y_{c2} + y_{PSM}) + c|. \tag{60}$$

The coefficients of the perpendicular line through the R segment are $$a = (y_{2p} - y_{1p})/l_R \tag{61}$$
$$b = (x_{1p} - x_{2p})/l_R$$
$$c = (x_{2p}y_{1p} - x_{1p}y_{2p})/l_R$$

where x1p, y1p and x2p,y2p are the endpoints of the line perpendicular to segment R computed from segment R center xc1,yc1, length 1R and angle theta1:

$$x_{1p} = -\frac{l_R}{2}\sin(\sigma_1) + x_{c1} \tag{62}$$

$$y_{1p} = \frac{l_R}{2}\cos(\sigma_1) + y_{c1}$$

$$x_{2p} = \frac{l_R}{2}\sin(\sigma_1) + x_{c1}$$

-continued $$y_{2p} = -\frac{l_R}{2}\cos(\sigma_1) + y_{c1}.$$

Registration Quality Control Algorithm

In application Ser. No. 099,800, the delta-d registration vector length difference is used to catch registrations that represent a bad fit, caused either by erroneous computed registration offsets resulting from picture selections with poor detail or by film problems (image stretching and/or internal misregister). In the present invention, the delta-d quality control check is still performed, as indicated in FIG. 1c, but for three registration points, delta-d is taken as the maximum delta-d computed from the vector length difference between R and M pictures over both vectors from point 2 origin to points 1 and 3. For two registration points, delta-d is computed as before. A passing delta-d represents a very high probability that the registration fit will be acceptable, and in this case no further quality control checks of the registration offset quality are performed.

For a failing delta-d check, however, it is important to be able to distinguish between bad offset data and a genuine film problem. Accordingly, the present invention invokes a new quality control check on the validity of each registration (good or bad offset data). The result of this quality control algorithm is a match quality index with only two possibilities: pass or fail. If all registrations and hence all pictures pass the match quality check, then film registration proceeds normally; however, if one or more registrations fail the match quality check (therefore one or more failed pictures are present), the locations of the pictures selections in each failed registration are displayed for the machine operator and that film is rejected (not punched). Appropriate operator action would be to register the film again with different picture selections.

The match quality index algorithm of the present invention has been developed by a heuristic method. It has proven to be highly reliable in the accuracy of its pass-fail judgments, as demonstrated over a large sample of film sets. The result of the algorithm reliability is that the machine throughput is increased, since the operator is given good feedback information on which to base a decision as to how to proceed in a problem situation. Moreover, the quality control function of the machine is enhanced by the match quality algorithm reliability, since if a problem remains (punch decision) after all pictures have been declared good by the match quality algorithm, the machine operator can be confident that the film in question has genuine fit problems, to within a very small uncertainty. The printing establishment can then pass the incidences of problems films back to the film suppliers, to help them sharpen up their own quality control process.

Conceptually, the match quality algorithm involves moving the M segment picture into supposed register with the R segment picture by the registration offset resulting from the PSM offset plus the least squares method offset.

If the two segment pictures form a good match, the generalized perimeter length is likely to be nearly equal in both pictures, where the perimeter length would be a sum over segment lengths that reflects how well the contribution segments matched up. The input data to the match quality algorithm is the list of segment pairs n1(k), n2(k) where n1 labels the reference segment and n2 labels the moved segment in the kth segment pair. k ranges only over those segment pairs that have passed the PSM acceptance criteria on lengths and angular separation given by applicable equations. (Equations 35 and 36 of application Ser. No. 099,800). Furthermore, k also ranges over only those segment pairs with a non-zero overlap of equation (59, with D generalized to also include the least squares registration offset xLSQ,yLSQ.

$$D = |a(x_{c2} + x_{PSM} + x_{LSQ}) + b(y_{c2} + y_{PSM} + y_{LSQ}) + c|. \quad (63)$$

The first measure of match quality is the following generalized perimeter ratio:

$$\text{score1} = 100 \times \quad (64)$$

$$\left\{ \frac{\sum_{\{k\}_n} (\text{overlap})_k \exp\left[\frac{-2}{M^2}(d_k - d_{min}(n_1(k)))^2\right]}{\sum_{\{k\}_d} l_R(n_1(k))} \right\}$$

In the numerator, dk is the perpendicular distance from the moved segment center xc2,yc2, translated into registration with the reference segment by the total registration offset, to the reference segment or $$d_k = |a_R(x_{c2} + x_{PSM} + x_{LSQ}) + b_R(y_{c1} + y_{PSM} + y_{LSQ}) + c_R|. \quad (65)$$

where the reference line coefficients are $$a_R = (y_{2r} - y_{1r})/l_R \quad (66)$$
$$b_R = (x_{1r} - x_{2r})/l_R$$
$$c_R = (x_{2r}y_{1r} - x_{1r}y_{2r})/l_R$$

and the references segment endpoints x1r,y1r,x2r,y2r are computed from the reference segment length lR, center xc1,yc1 and angle:

$$x_{1r} = \frac{l_R}{2}\cos(\sigma_1) + x_{c1} \quad (67)$$

$$y_{1r} = \frac{l_R}{2}\sin(\sigma_1) + y_{c1}$$

$$x_{2r} = -\frac{l_R}{2}\cos(\sigma_1) + x_{c1}$$

$$y_{2r} = -\frac{l_R}{2}\sin(\sigma_1) + y_{c1}.$$

Since R segment n1 can match more than one M segment n2, there is a closest matching dk for each n1(k) called dmin(n1(k)) in the numerator of equation 64. The (overlap)k multiplies a Gaussian measure of fit closeness with length scale M, where $$M = \text{MAXIMUM}(O_{\nu}k * \text{SIN}(\text{ABSOLUTE}(THETA1 - THETA2))) \quad (68)$$

measures maximum segment separation over a distance overlap due to segment angular mismatch. The MAXIMUM in M is taken over all k. The restricted numerator sum $\{k\}_n$ in equation 64 runs only over the close matches such that $$\text{ABSOLUTE}(d_k - d_{min}(n_1(k))) <= M. \quad (69)$$

The restricted denominator sum $\{k\}_d$ runs only over those reference segment lengths 1R that belong to the closest matches that determine dmin(n1(k)). In a good match (higher score1), the numerator overlaps for multiple matches of n2 segments to n1 will tend to add up to the denominator sum, with small penalty due to the Gaussian weighting factor. In a poor match, the multiple matching will be reduced, the Gaussian weighting will product more penalty and score1 will be lower. Empirically, it has been determined that a picture can be rejected by the following criterion $$\text{REJECTION: score1} <= 53 \quad (70)$$

score1 is not quite enough to completely judge a match, however, since one can have just a few matches in the equation 64 sums and therefore poor statistics. A measure of good statistics in the segment match is a higher score in the following difference:

$$\text{score2} = \sum_{\{k\}_n}(1) = \sum_{\{k\}_d}(1), \quad (71)$$

in other words the excess matches due to multiple matching of more than one n2 with n1. Empirically, it has been determined that a picture can be rejected by the following criterion:

$$\text{REJECTION: score2} <= 3 \quad (72)$$

In summary, the match quality index is the following:

MATCH QUALITY INDEX: PASS (DO NOT REJECT) (73)
  score1 > 53 AND score2 > 3
MATCH QUALITY INDEX: FAIL (REJECT)
  score1 <= 53 OR score2 <= 3

Concurrent Processing

In the method and apparatus described in application Ser. No. 099,800, algorithmic computation is not performed while the motion table of the machine is in motion; therefore, the motion times and computation times add serially to the machine cycle time. Since a significant decrease in cycle time has a large effect on the productivity output of the machine, in the method and apparatus of the present invention, the control software is modified to enable certain machine motions to occur simultaneously with algorithmic computations. These motion times overlap with the computation times to produce a significant decrease in the overall machine cycle time. The cycle time decrease due to the concurrent processing amounts to about 25 seconds for two point registration and 45 seconds for three point registration, the latter time savings being especially significant. The concurrent processing is accomplished entirely in control software and involves no apparatus modification.

There are two motions that are overlapped with computation: (1) the motion from one registration point to the next registration point and (2) the motion after the last registration picture has been recorded to a location close to the punching location (the final small punch move that results in punch hole locations required for registration cannot be made until all offset data has been accumulated and the final registration computations performed).

Summarizing with reference to FIG. 1c, the offsets are computed for either two or three points. In block 52, Δd is computed as the absolute value of the RHS of equation 10 applied between points 2 and 1 for two points or the maximum Δd computed between points 21, 23 for three points. The maximum image stretch S is computed and is, for two points, twice the maximum absolute splitting or $$S = \text{maximum} [|2Ex|, |2Ey|] \tag{74a}$$

where Ex,Ey is given by equations 47 or 51. For three points, a better S than equation 74a can be computed as $$S = \text{maximum} [|erxI - erxJ|, |eryK - eryL|] \tag{74b}$$

where the erxi,eryi are from equation (38) as corrected by equation (38b) and I,J are the two points that promote the biggest absolute x difference in equation (74b). Similarly, K,L are the two points that promote the biggest absolute y difference in equation (74b).

If Δd is less than or equal to the Δdlimit limit, typically 3.3 mils, the registration is of good quality and block 54 is entered to compare S with nominal stretching tolerances (one mil for sharp edges such as reverse type or 3 mil for halftones). If S exceeds the standard tolerance, an advisory "caution" message is displayed to the machine operator and block 58 is entered. If S is within the standard tolerance, block 58 is entered directly from block 54 because the advisory message of block 56 is not called for. In block 58, the punch moves of equations 1 (with ex,ey omitted) are computed using the angle of equation 29 with N set as either two or three, as previously described. In block 60, the option of bypassing difference splitting is offered and if exercised, block 62 is entered. If difference splitting is elected, block 64 is entered first and the punch moves of block 58 are modified to the full equations 1, with ex,ey computed either from equations 38b and 32 for three points or equations 47 or 51 for two points. In block 62, the film is moved and punched.

If Δd exceeds the system Δdlimit limit, the alternative path is taken from block 52 to block 68, where the quality of the registration is checked by the computed registration quality index of equation 73. Block 70 indicates the display of all pictures which are determined t be bad so that the operator is given information identifying the bad quality pictures. These films are not punched, as indicated in block 72. If all images pass the quality check of block 68, the maximum stretch S is compared with a user defined tolerance (typically 7 mils which equals a row of 150 line screen halftone dots). If the stretch exceeds the user tolerance, box 72 is entered and the film is not punched. If the stretch is within the user tolerance, a choice is given in block 76 allowing the user to select whether the film is to be punched. If the no punch option is selected, block 72 is entered and the film is terminated, if the punch election is made, block 58 is entered and the sequence described previously is followed.

It is important to understand that the method and apparatus of the present invention is useful to register color separation films that contain macroscopic edges which align when the films are registered. The content of the films may be halftone dot details and/or detail that comprises reverse type or register marks.

From the foregoing, it will be seen that this invention is one well adapted to attain all the ends and objects hereinabove set forth together with other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative and not in a limiting sense.

Having thus described the invention, what is claimed is:

1. In a method of registering a pair of color separation films containing macroscopic edges which align when the films are registered, the steps of:
   selecting one of the films as a reference film;
   recording first, second and third pictures of the reference film containing macroscopic edges and centered at spaced apart first, second and third locations, respectively;
   recording fourth, fifth and sixth pictures of the other film containing macroscopic edges and centered at locations on the other film which approximately correspond to but may be offset from the respective first, second, and third locations;
   extracting from said first and fourth pictures the locations of corresponding macroscopic edges on the reference film and on the other film;
   extracting from said second and fifth pictures the locations of corresponding macroscopic edges on the reference film and on the other film;
   extracting from said third and sixth pictures the locations of corresponding macroscopic edges on the reference film and on the other film; and
   determining the offset between the edge locations on the reference film and the corresponding edge locations on the other film to thereby determine the positional adjustment of the other film necessary for registration with the reference film.

2. The method of claim 1, wherein each picture comprises a digital picture and including the step of transforming gray levels of each digital picture prior to
   extracting therefrom the locations of the corresponding macroscopic edges.

3. The method of claim 1, wherein the step of extracting the locations of said corresponding macroscopic edges comprises for each picture the steps of:
   obtaining a systematically sampled convolution output to produce a reduced resolution determination of the locations of edge points on the macroscopic edges of the picture and the edge direction at each such location; and
   interpolating said convolution output in a manner to obtain a determination of the locations of the edge points on the macroscopic edges of the picture that is at least twice as accurate as interpolation of said convolution output from the reduced resolution to full resolution.

4. The method of claim 3, wherein said determining step comprises using the parameter space method to match edges on the reference film and the other film and the edges matched by the parameter space method are based on the results of said interpolating step, whereby offsets produced by the parameter space method are at least doubly accurate.

5. The method of claim 1, wherein said determining step comprises effecting a coordinate transformation using an origin at one of said locations at which the pictures are centered and a rotation angle that effects registration of the films, said step of effecting a coordinate transformation comprising the further step of effecting difference splitting to produce a translation component which represents a registration compromise.

6. The method of claim 5, wherein said step of effecting difference splitting comprises determining a pair of image stretching coefficients $\alpha_x, \alpha_y$ along mutually perpendicular x and y axes from a least squares solution of the equation:

$$\alpha_x d_{xij} \cos \theta_{ij} + \alpha_y d_{yij} \sin \theta_{ij} = d_{Mij} - d_{Rij}$$

where R is a vector connecting two points xi,yi and xj,yj having a length of dRij on the reference film, thetaij is the angle from the x axis to the vector R, dxij,dyij are the absolute component lengths of vector R along the respective x and y axes and the vector corresponding to the vector R on the other film is represented R+Sij by vector addition and has a length DMij, where Sij is a stretching vector given by $$S_{ij} = \alpha_x d_{xij} X + \alpha_y d_{yij} y.$$

7. The method of claim 6, wherein said step of effecting difference splitting further comprises determining split the difference translations ex and ey along the respective x and y axes in accordance with $$-e_x = \left(\frac{L_x}{2}\right)\alpha_x$$

$$-e_y = \left(\frac{L_y}{2}\right)\alpha_y$$

where Lx and Ly are the side lengths of a box along the respective x and y axes with said box minimally confining said first, second and third locations.

8. The method of claim 1, including the step of algorithmically computing a quality control edge segment match quality index based on the registration offsets at said first and fourth locations, second and fifth locations and third and sixth locations.

9. In a method of registering a pair of color separation films containing macroscopic edges, the steps of:
selecting one of the films as a reference film;
recording at least first and second digital pictures of the reference film containing macroscopic edges and centered at spaced apart first and second locations, respectively;
recording at least third and fourth digital pictures of the other film containing macroscopic edges and centered at locations on the other film which approximately correspond to but may be offset from the respective first and second locations;
determining the locations of edge points on the macroscopic edges of each picture and the edge direction at each such edge point location by obtaining a systematically sampled convolution output effective to produce a reduced resolution determination of said edge point locations and edge directions;
interpolating said convolution output in a manner to obtain an interpolated determination of said edge point locations that is at least twice as accurate as interpolation from the reduced resolution to full resolution; and
using said interpolated determination of said edge point locations in the parameter space method to match macroscopic edges on said first and third pictures and to match macroscopic edges on said second and fourth pictures, thereby producing offsets for the matched macroscopic edges that are at least doubly accurate.

10. Apparatus for effecting registration between a pair of color separation films containing macroscopic edges which align when the films are registered, since apparatus comprising:
means for recording first, second and third digital pictures containing macroscopic edges on one of the films centered at respective first, second and third locations spaced apart on said one film;
means for recording fourth, fifth and sixth digital pictures containing macroscopic edges on the other film centered at locations on said other film which approximately correspond to but may be offset from the respective first, second and third locations;
means for extracting the locations of corresponding macroscopic edges on said first and fourth pictures, on said second and fifth pictures and on said third and sixth pictures; and
means for computing the offsets between the macroscopic edge locations on said one film and the corresponding macroscopic edge locations on said other film to thereby determine the positional adjustment necessary to effect registration of the films.

11. Apparatus as set forth in claim 10, wherein said extracting means comprises:
means for extracting from each picture a systematically sampled convolution output representing a reduced resolution determination of the locations of edge points located on the macroscopic edges of each picture and the edge direction at each such edge location; and
means for interpolating said convolution output in a manner to obtain an interpolated determination of the locations of the macroscopic edge points that is more accurate than the result of interpolating the convolution output to full resolution.

12. Apparatus as set forth in claim 11, wherein said computing means comprises means for using said interpolated determination in the parameter space method to compute said offsets more accurately than would result from use of data derived from interpolating the convolution output to full resolution.

13. Apparatus for registering a pair of color separation films containing macroscopic edges which align when the films are registered, said apparatus comprising:
a digital camera operable to record digital pictures;
means for effecting relative motion between said camera and each film to align the camera with selected locations on each film and record digital pictures at two spaced apart locations on each film which correspond to but may be offset from corresponding locations on the other film;
means for computing from the image data on each digital picture the locations of edge points which lie on the macroscopic edges of the picture, said computing means being operable to carry out computations for each digital picture while relative motion between said camera and the film is being effected;

means for calculating the offset between the corresponding macroscopic edges on the films; and means for using said offset to locate punch hole positions on the films that effect registration of the films upon alignment of the punch hole positions.

14. Apparatus as set forth in claim 13, including:

means for punching each film to form plural punch holes therein;

means for effecting approximate alignment between said punching means and the punch hole positions on each film; and means for effecting exact alignment between said punching means and the punch hole positions on each film, said calculating means being operable to calculate said offset while relative motion is being effected between said punching means and the film by said means for effecting approximate alignment.

15. In a method of registering a pair of color separation films containing macroscopic edges which align when the films are registered, the steps of:

recording at least first and second digital pictures of the reference film containing macroscopic edges and centered at spaced apart first and second locations, respectively;

recording at least third and fourth digital pictures of the other film containing macroscopic edges and centered at locations on the other film which approximately correspond to but may be offset from the respective first and second locations;

extracting from said first and third pictures the locations of corresponding macroscopic edges on the reference film and on the other film;

extracting from said second and fourth pictures the locations of corresponding macroscopic edges on the reference film and on the other film;

determining the offset between the edge locations on the reference film and the corresponding edge locations on the other film to thereby determine the positional adjustment of the other film necessary for registration with the reference film; and algorithmically computing a quality control edge segment match quality index based on the registration offsets at said first and third locations and said second and fourth locations.

16. In a method of registering a pair of color separation films containing macroscopic edges which align when the films are registered, the steps of:

selecting one of the films as a reference film;

recording first, second and third pictures of the reference film containing macroscopic edges and centered at spaced apart first, second and third locations, respectively;

recording fourth, fifth and sixth pictures of the other film containing macroscopic edges and centered at locations on the other film which approximately correspond to but may be offset from the respective first, second and third locations;

extracting from said first and fourth pictures the locations of corresponding macroscopic edges on the reference film and on the other film;

extracting from said second and fifth pictures the locations of corresponding macroscopic edges on the reference film and on the other film;

extracting from said third and sixth pictures the locations of corresponding macroscopic edges on the reference film and on the other film, said extracting step comprising for each picture the step of obtaining a systematically sampled convolution output to produce a reduced determination of the locations of edge points on the macroscopic edges of the picture and the edge direction at each such location; and the step of interpolating said convolution output in a manner to obtain a determination of the locations of the edge points on the macroscopic edges of the picture that is at least twice as accurate as interpolation of said convolution output from the reduced resolution to full resolution; and determining the offset between the edge locations on the reference film and the corresponding edge locations on the other film to thereby determine the positional adjustment of the other film necessary for registration with the reference film.

* * * * *